(12) United States Patent
Li et al.

(10) Patent No.: US 12,733,464 B2
(45) Date of Patent: Sep. 8, 2026

(54) STRUCTURE HAVING 2D MATERIAL CAPPING LAYER AND MANUFACTURING METHOD THEREOF

(71) Applicant: Taiwan Semiconductor Manufacturing Company, Ltd., Hsinchu (TW)

(72) Inventors: Shu-Wei Li, Hsinchu (TW); Shin-Yi Yang, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 18/479,808

(22) Filed: Oct. 2, 2023

(65) Prior Publication Data

US 2025/0112089 A1 Apr. 3, 2025

(51) Int. Cl.

| | |
|---|---|
| ***H10W 20/00*** | (2026.01) |
| ***H10W 20/41*** | (2026.01) |
| ***H10W 20/44*** | (2026.01) |

(52) U.S. Cl.

CPC ....... *H10W 20/033* (2026.01); *H10W 20/076* (2026.01); *H10W 20/425* (2026.01); *H10W 20/4462* (2026.01)

(58) Field of Classification Search

CPC ......... H01L 21/76843; H01L 21/76831; H01L 23/53238; H01L 23/53276

See application file for complete search history.

(56) References Cited

U.S. PATENT DOCUMENTS

| | | | | |
|---|---|---|---|---|
| 7,977,791 | B2 * | 7/2011 | Chang | H01L 21/76849 257/751 |
| 2022/0415818 | A1 * | 12/2022 | Naylor | H01L 21/76849 |
| 2024/0030062 | A1 * | 1/2024 | Hausmann | C23C 16/45565 |

* cited by examiner

*Primary Examiner* — Michael Jung
(74) *Attorney, Agent, or Firm* — JCIPRNET

(57) ABSTRACT

A structure including a conductive region, a dielectric region, and a capping layer is provided. The conductive region is disposed on or embedded in the dielectric region. The capping layer is disposed on the conductive region. A material of the capping layer includes a 2D material.

20 Claims, 15 Drawing Sheets

600
80
89
60
51
80
83 82 81
41
20
10
R2
Z 500
71
60
51
41
20
10
Z 60
51
41
20
73
10
33
1400
Z

R5
1300

1900
80
89
60
52
42
20
10
33
R8
Z
1800
74

STRUCTURE HAVING 2D MATERIAL CAPPING LAYER AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, the device quality and/or yield can often be improved through material selection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
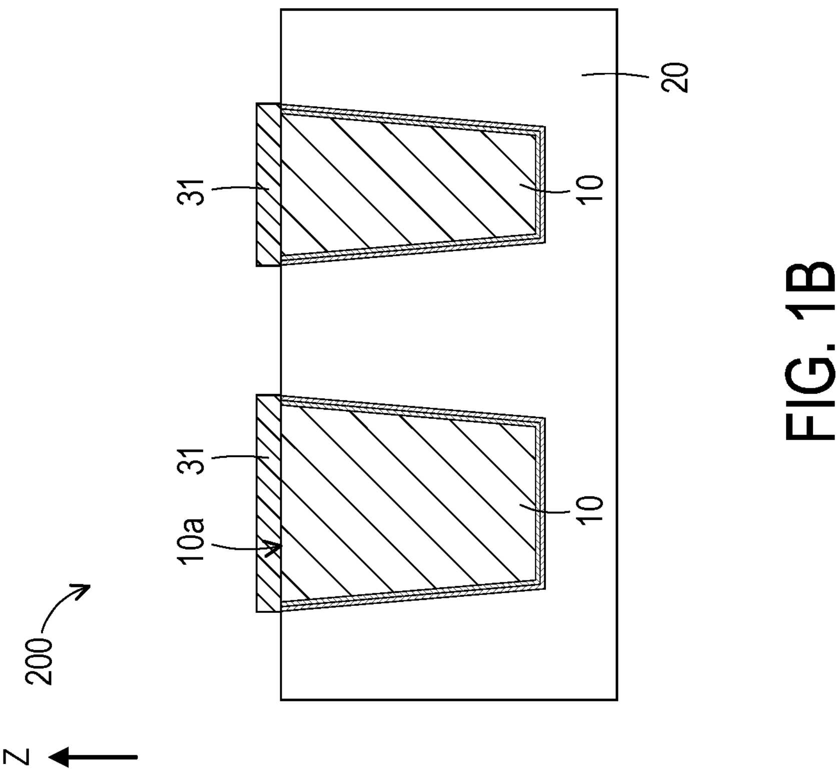
FIGS. 1A-1F illustrate various cross-sectional views of some embodiments of a method of forming an electronic device.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1F illustrate various cross-sectional views of some embodiments of a method of forming an electronic device.

Figure 1A:
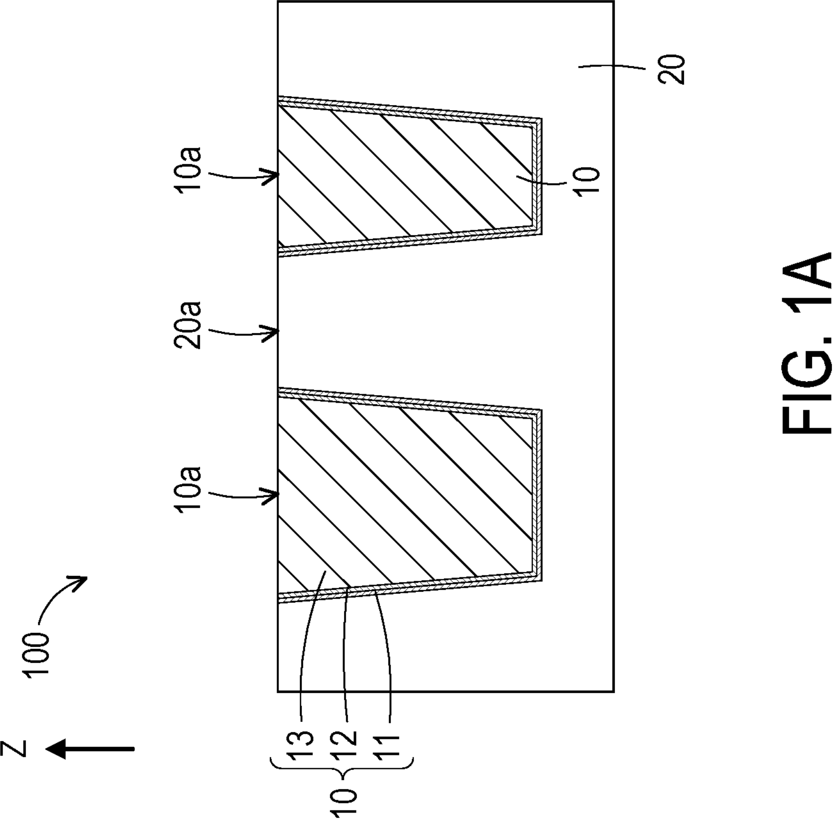

As shown in cross-sectional view of FIG. 1A, a structure 100 including a conductive region 10 and a dielectric region 20 is provided.

In an embodiment, the structure 100 may be disposed on a substrate (not shown) or a portion of a substrate. The aforementioned substrate may be, for example, a wafer, a board (e.g., an FR-4 board), or a glass, but the disclosure is not limited thereto.

In an embodiment, the conductive region 10 and/or the dielectric region 20 may be formed by a deposition process (e.g., physical vapor deposition (PVD), chemical vapor deposition (CVD), atomic layer deposition (ALD), or the like), and/or a plating process (e.g., electroplating, electroless plating, etc.), but the disclosure is not limited thereto.

In an embodiment, the conductive region 10 may be disposed on and/or embedded in the dielectric region 20. In an embodiment, a top surface 10_a_ of the conductive region and a top surface 20_a_ of the dielectric region 20 may be coplanar by performing a planarization process (e.g., a chemical mechanical planarization (CMP) process).

In an embodiment, a dielectric constant (k value) of the dielectric region 20 is about 1.5~3.9.

The conductive region 10 may be a single-layer structure or a multi-layer stacked structure. A material of the conductive region 10 may include, for example, aluminum (Al), cobalt (Co), copper (Cu), iron (Fe), indium (In), iridium (Ir), manganese (Mn), molybdenum (Mo), nickel (Ni), osmium (Os), ruthenium (Ru), tantalum (Ta), titanium (Ti), tungsten (W), zinc (Zn), zirconium (Zr), an alloy thereof, and/or a eutectic thereof.

In an embodiment, the conductive region 10 may include a first conductive layer 11, a second conductive layer 12, and a third conductive layer 13, but the disclosure is not limited thereto. The first conductive layer 11 may be disposed on the dielectric region 20, the second conductive layer 12 may be disposed on the first conductive layer 11, and the third conductive layer 13 may be disposed on the second conductive layer 12.

A material of the first conductive layer 11 may include, for example, Ta, Ti, Ru, In, Zn, Mn, Zr, W, Mo, Os, Ir, Al, Fe, Ni, an alloy thereof, and/or a eutectic thereof. In an embodiment, a material of the first conductive layer 11 excludes copper substantially. In an embodiment, the first conductive layer 11 may be referred as a barrier layer.

A material of the second conductive layer 12 may include, for example, Co, Ru, Mn, Zn, Zr, W, Mo, Os, Ir, Al, Fe, Ni, an alloy thereof, and/or a eutectic thereof. In an embodiment, the second conductive layer 12 may be referred as a liner layer or a conductive glue layer.

A material of the third conductive layer may include, for example, Co, Cu, Ni, Ru, W, Mo, Ti, Zr, Ta and Zn, an alloy thereof, and/or a eutectic thereof. The thickness and/or cross-sectional area of the third conductive layer 13 are/is substantially greater than the thickness and/or cross-sectional area of the second conductive layer 12 and/or the first conductive layer 11. In an embodiment, the third conductive layer 13 may be referred as a conductive damascene layer.

As shown in cross-sectional view of FIG. 1B, a structure 200 including a capping layer 31 is provided. The capping layer 31 may be formed by a suitable process. For example, the capping layer 31 may be formed by a bottom-up deposition; or, a top-down removing process. For example, the capping layer 31 may be formed by a deposition process (e.g., chemical vapor deposition (CVD), atomic layer deposition (ALD), vapor transport deposition (VTD), or the like). For example, the capping layer 31 may be formed by an exfoliation process (e.g., sonication, mechanical, hydrothermal, electrochemical, laser-assisted, and microwave-assisted exfoliation). A further process, such as a patterning process (e.g., a lithography and etching process, or the like) or a thermal process (e.g., heating, annealing, or the like), may be performed for forming the capping layer 31.

The capping layer 31 may be formed corresponding to the conductive region 10. For example, the capping layer 31 may be disposed on the top surface 10*a* of the conductive region 10, or further in direct contact therewith. In an embodiment, a thickness T31 of the capping layer 31 is about 3 angstroms (Å) to 300 angstroms.

A material of the capping layer 31 may include or be a 2D material. Atoms forming the 2D material substantially have no corresponding bonds or only weak bonds (van der Waals bonds) in one direction, and may form corresponding bonds (e.g., covalent bonding or ionic bonding) in a direction perpendicular to the aforementioned one direction. In an embodiment, there may be substantially no dangling bond in the aforementioned one direction of the 2D material. As such, subsequent substances would be more difficult (but that doesn't mean they won't) to deposit or attach directly to the 2D material. In an embodiment, in the thickness direction or the deposition direction (e.g., the z direction) of the capping layer 31, atoms forming the capping layer 31 substantially have no corresponding bonds or only weak bonds, and/or there may be substantially no dangling bond. That is, subsequent substances would be more difficult (but that doesn't mean they won't) to deposit or attach directly to the capping layer 31 in the thickness direction or the deposition direction (e.g., the z direction) thereof. As such, an overall thickness of a structure having a capping layer comprising a 2D material may be reduced.

In an embodiment, the capping layer 31 may be a conductor. A material of the capping layer 31 may include or be graphene, intercalated graphene, N-doped graphene, O-doped graphene, modified graphene, transition metal dichalcogenides (TMDs or TMDCs). The transition metal dichalcogenide include, for example, molybdenum sulfide ($MoS_2$), tantalum sulfide ($TaS_2$), hafnium sulfide ($HfS_2$), hafnium selenide ($HfSe_2$), tungsten selenide ($WSe_2$), or a ternary compound thereof (e.g., $HfS_{2(1-x)}Se_{2x}$).

In an embodiment, a material of the capping layer 31 may exclude cobalt (Co). Copper (Cu) is substantially a major constituent element of the conductive region 10, a Co-containing capping layer may induce and/or increase a Cu electromigration. Additionally, a resistivity of a conductor (e.g., the conductive region 10 and/or a conductor formed on the capping layer) may be increased due to an electron scattering on the Co and Cu interface and/or Co diffusion into Cu. Moreover, for carbon-doped oxide (CDO), carbon incorporated silicon oxide (SiOC), nitrogen-doped silicon carbide (NDC), and/or ornithine decarboxylase (ODC), or other etching stop layer (ESL) materials, the deposition selectivity on a general dielectric material and a Co-containing material is substantially the same or similar. As such, an ESL material could be easily deposited on a Co-containing material, and a capacitive effect of the conductor may be increased, a signal transmission quality may be decreased.

Figure 1D:
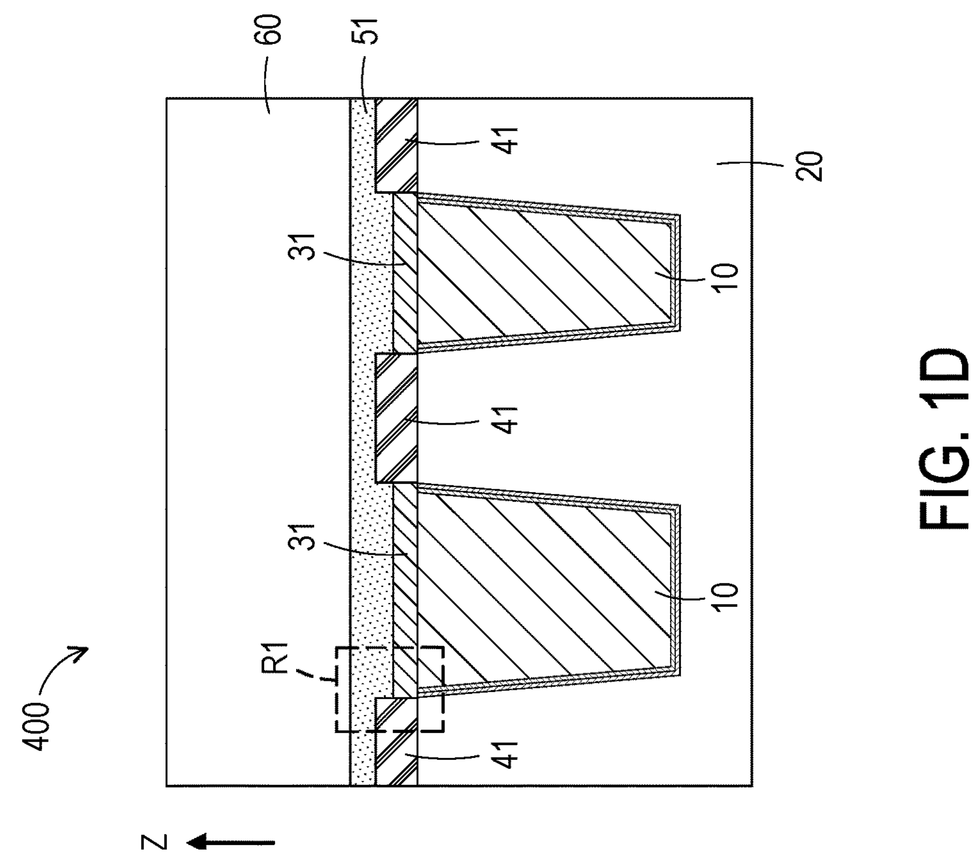
Figure 1C:
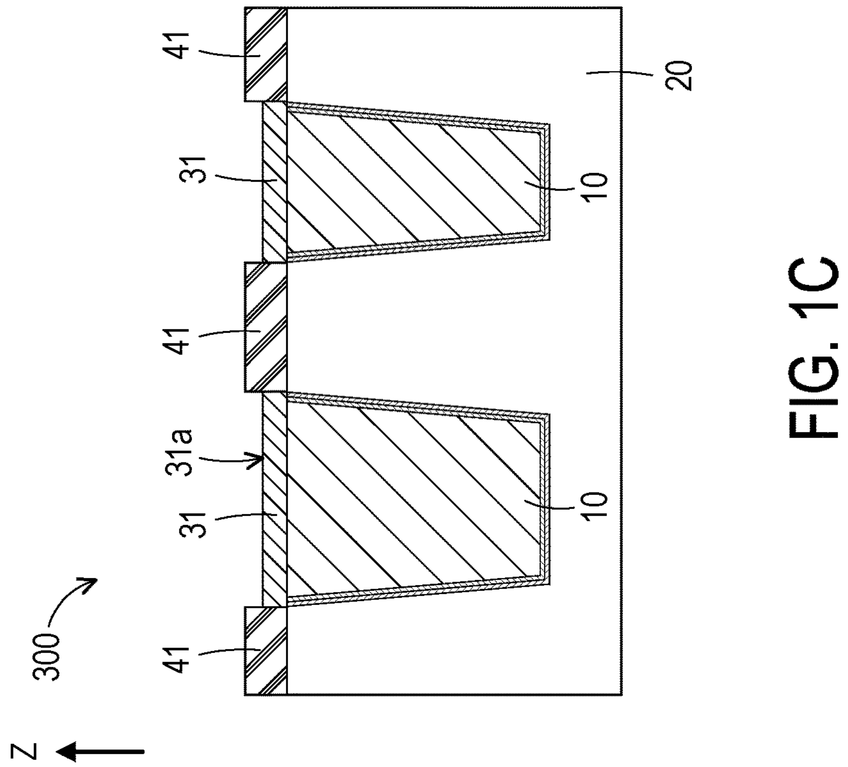

As shown in cross-sectional view of FIG. 1C, a structure 300 including a first insulating layer 41 is provided. The first insulating layer 41 may be formed by a suitable process (e.g., a deposition process).

In an embodiment, the process of forming the first insulating layer 41 may be a mask-free or maskless process. That is, during the formation of the first insulating layer 41, there may be no masking or shielding on the capping layer 31. Additionally, the first insulating layer 41 would be difficult to deposit or attach directly to the top surface 31*a* of the capping layer 31 due to the material properties of the capping layer 31.

In an embodiment, there may be substantially no first insulating layer 41 deposit or attach directly to the top surface 31*a* of the capping layer 31.

In an embodiment, a material of the first insulating layer 41 may include carbon-doped oxide (CDO), carbon incorporated silicon oxide (SiOC), nitrogen-doped silicon carbide (NDC), and/or ornithine decarboxylase (ODC). In an embodiment, the first insulating layer 41 may be referred as an etching stop layer (ESL), but the disclosure is not limited thereto.

In an embodiment, the first insulating layer does not directly contact a copper material of the conductive region 10 (e.g., the third conductive 13 of the conductive region 10) substantially.

In an embodiment, a top surface of the first insulating layer 41 and the top surface 31*a* of the capping layer 31 are not coplanar. In an embodiment, in the thickness direction or the deposition direction (e.g., the z direction), the height difference D1 between the top surface of the first insulating layer 41 and the top surface 31*a* of the capping layer 31 is about 1 angstrom to 1000 angstroms.

As shown in cross-sectional view of FIG. 1D, a structure 400 including one or more insulating layers disposed on the first insulating layer 41 is provided. FIG. 1G may be an enlarged view of region R1 as shown in FIG. 1D. In an embodiment, one or more insulating layers disposed on the first insulating layer 41 may include a low-k layer, an anti-reflective coating layer (ARL) (e.g., a nitrogen-free anti-reflective coating layer (NFARL)), a hard mask layer, or stacked layers thereof, but the disclosure is not limited thereto. For example, the second insulating layer 51 and the third insulating layer 60 may be formed by a suitable process (e.g., a deposition process) and disposed on the first insulating layer 41 and the capping layer 31.

In an embodiment, a material or a formation process of the insulating layer (e.g., the second insulating layer 41 as shown in FIG. 1D) directly contacting the first insulating layer 41 is different from a material or a formation process of the first insulating layer 41. As such, there may be a contact interface F1 therebetween.

In an embodiment, a thickness of the insulating layer (e.g., the second insulating layer 51 as shown in FIGS. 1D and/or 1G) directly contacting the first insulating layer 41 is thicker than a thickness of the first insulating layer 41. For example, a thickness T51 of a portion of the second insulating layer 51 disposed on the first insulating layer 41 is thicker than a thickness T41 of the first insulating layer 41.

In an embodiment, the insulating layer (e.g., the second insulating layer 51 as shown in FIGS. 1D and/or 1G) directly contacting the first insulating layer 41 may be formed by a same process to have a uniform material. That is, the material of the insulating layer (e.g., the second insulating layer 51 as shown in FIGS. 1D and/or 1G) directly contacting the first insulating layer 41 may be a homogeneous material without any interface therein.

Figures 1E, 1F:
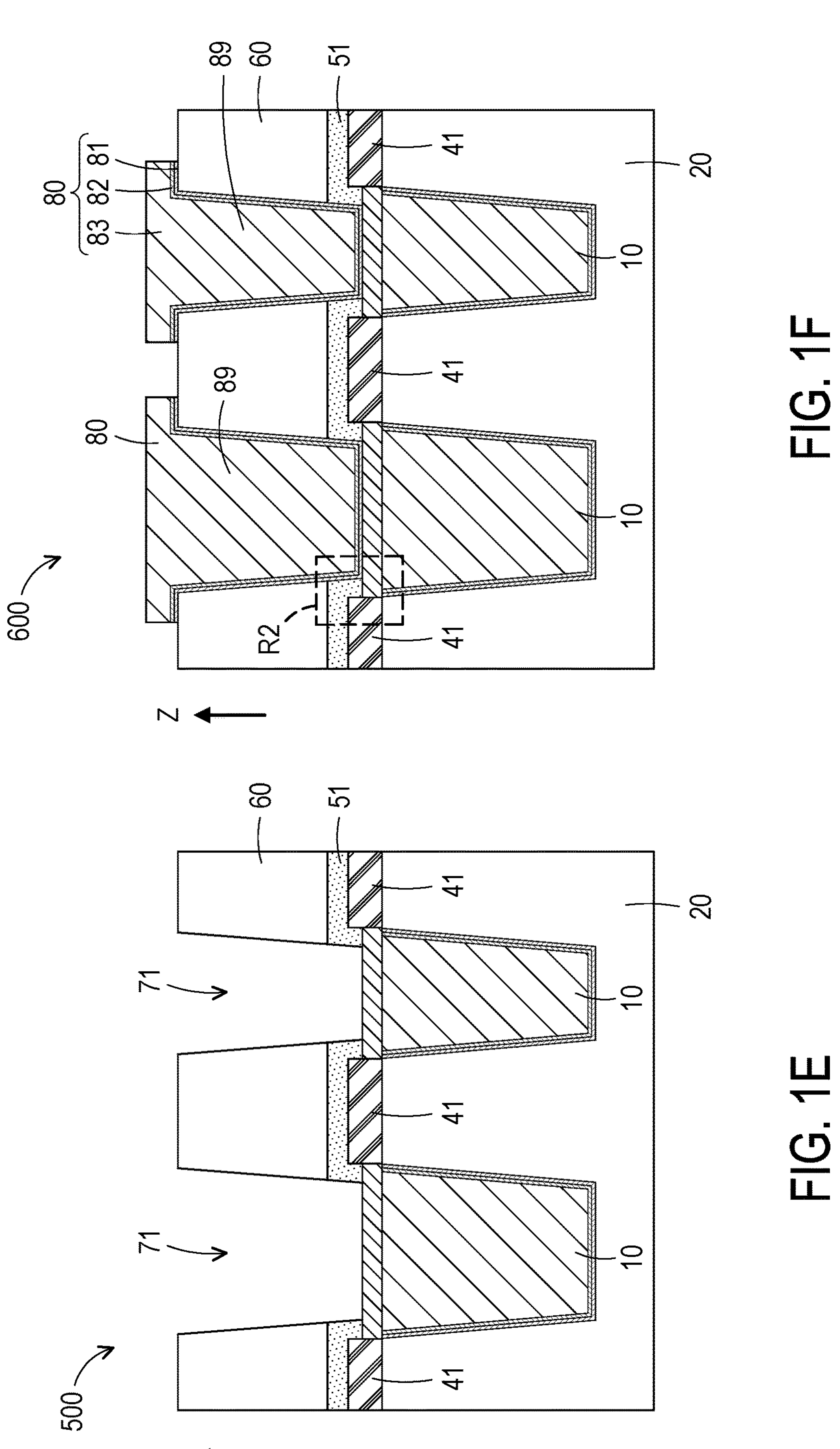

As shown in cross-sectional view of FIG. 1E, a structure 500 having at least one hole or trench 71 is provided. The hole or trench 71 may be formed by a suitable process (e.g., a lithography and etching process). A portion of the insulating layer(s) (e.g., the second insulating layer 51 and the third insulating layer 60) disposed on the capping layer 31 may be removed, and further, a portion of the capping layer 31 may be exposed.

Figure 1H:
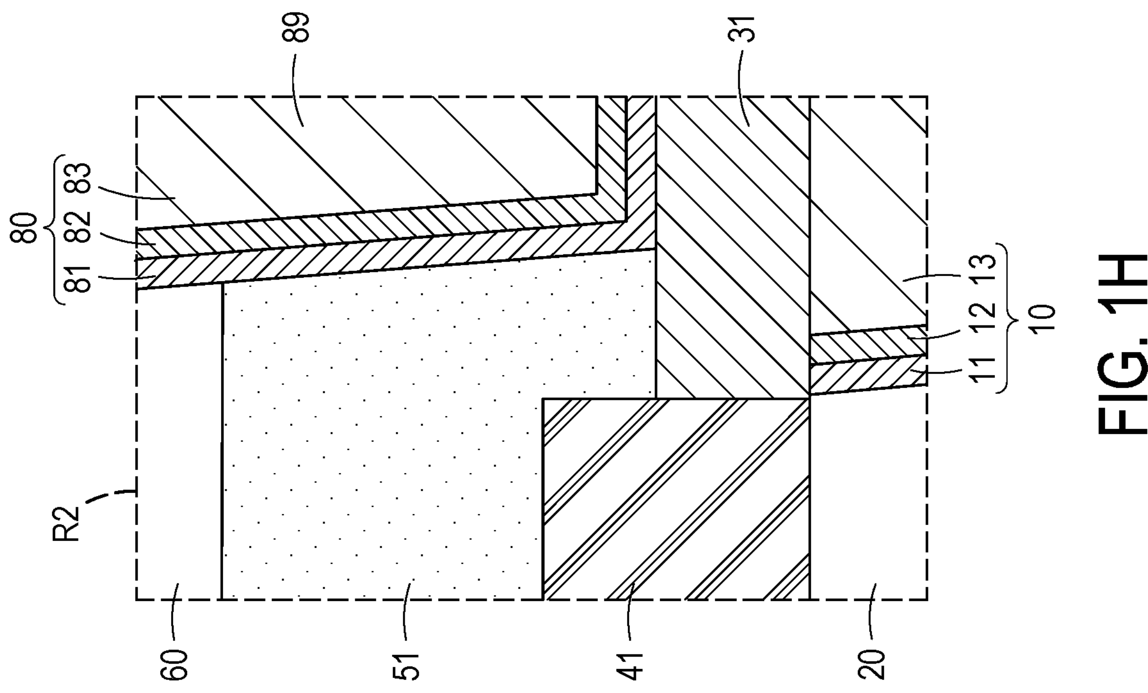
FIGS. 1G and 1H illustrate various cross-sectional views of a structure.
Figure 1G:
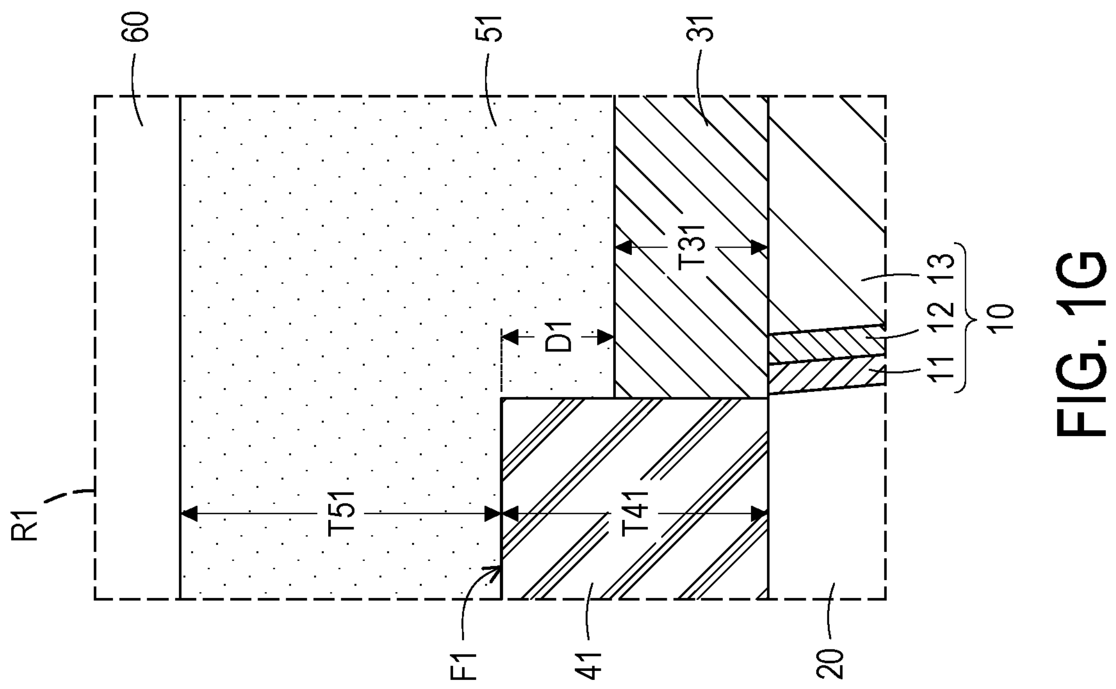

As shown in cross-sectional view of FIG. 1F, a structure 600 including a conductor 80 is provided. FIG. 1H may be an enlarged view of region R2 as shown in FIG. 1F. The conductor 80 may be a single conductive layer or a plurality of stacked conductive layers, but the disclosure is not limited thereto.

The conductive material for forming the conductor 80 may be further filled into the hole or trench 71 (as shown in FIG. 1E) to form a conductive via 89 in a form of, for example, a cone, a pillar, or a strip. The conductive via 89 could be referred as a conductor or a portion of a conductor (e.g., a portion of the conductor 90). In an embodiment, the conductor 80 may be a circuit, a portion thereof, a conductive terminal, or a portion thereof, but the disclosure is not limited thereto.

In an embodiment, the conductor 80 may include a first conductive layer 81, a second conductive layer 82, and a third conductive layer 83, but the disclosure is not limited thereto. In an embodiment, a formation process and/or a material of the first conductive layer 81, the second conductive layer 82, and the third conductive layer 83 may be the same or similar to the formation process and/or the material of the aforementioned first conductive layer 11, the aforementioned second conductive layer 12, and the aforementioned third conductive layer 13, respectively, but the disclosure is not limited thereto.

In an embodiment, a portion of the capping layer 31 may be disposed between the corresponding conductor 80 and the corresponding conductive region 10. In an embodiment, the conductor 80 may be electrically connected to the corresponding conductive region 10 through the corresponding portion of the capping layer 31.

FIGS. 2A-2D illustrate various cross-sectional views of some embodiments of a method of forming an electronic device. In some embodiments, FIGS. 2A-2D may illustrate an exemplary method of forming an electronic device after the structure as shown in FIG. 1B.

Figure 2B:
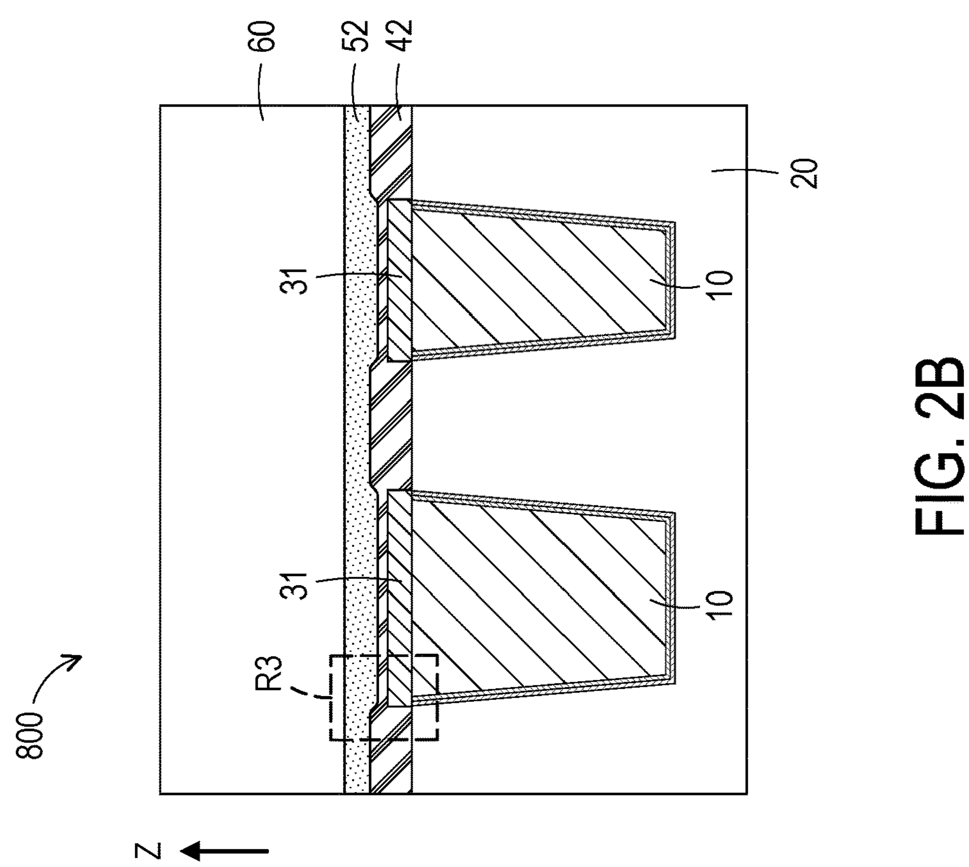
FIGS. 2A-2D illustrate various cross-sectional views of some embodiments of a method of forming an electronic device.
Figure 2A:
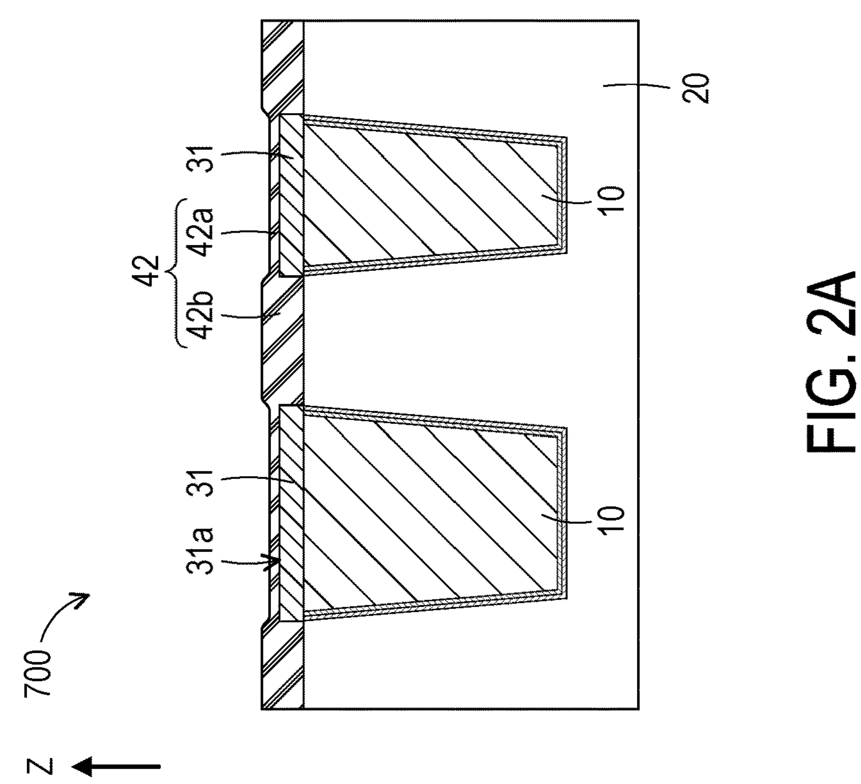

As shown in cross-sectional view of FIG. 2A, a structure 700 including a first insulating layer 42 is provided. A formation process and/or a material of the first insulating layer 42 may be the same or similar to the formation process and/or the material of the aforementioned first insulating layer 41.

In an embodiment, a portion of the first insulating layer 42 may deposit or attach directly to the top surface 31*a* of the capping layer 31. The first insulating layer 42 may include a first portion 42*a* and a second portion 42*b*. In the thickness direction or the deposition direction (e.g., the z direction), the first portion overlaps the capping layer 31, and the second portion does not overlap the capping layer 31. A thickness T42*b* (as shown in FIG. 2E) of the second portion 42*b* may be thicker than a thickness T42*a* (as shown in FIG. 2E) of the first portion 42*a*.

In an embodiment, a top surface of the first portion 42*a* and a top surface of the second portion 42*b* are not coplanar. In an embodiment, in the thickness direction or the deposition direction (e.g., the z direction), the height difference D2 between the top surface of the first portion 42*a* and the top surface of the second portion 42*b* is about 1 angstrom to 1000 angstroms.

As shown in cross-sectional view of FIG. 2B, a structure 800 including one or more insulating layers (e.g., the second insulating layer 52 and the third insulating layer 60) disposed on the first insulating layer 42 is provided. FIG. 2E may be an enlarged view of region R3 as shown in FIG. 2B.

In an embodiment, a formation process and/or a material of the one or more insulating layers (e.g., the second insulating layer 52 and the third insulating layer 60 as shown in FIG. 2B and/or 2E) may be the same or similar to the formation process and/or the material of the aforementioned one or more insulating layers (e.g., the second insulating layer 51 and the third insulating layer 60 as shown in FIG. 1D and/or 1G).

The first portion 42*a* of the first insulating layer 42 may be disposed between the one or more insulating layers (e.g., the second insulating layer 52 and the third insulating layer 60 as shown in FIG. 2B and/or 2E) and the capping layer 31.

Figures 2C, 2D:
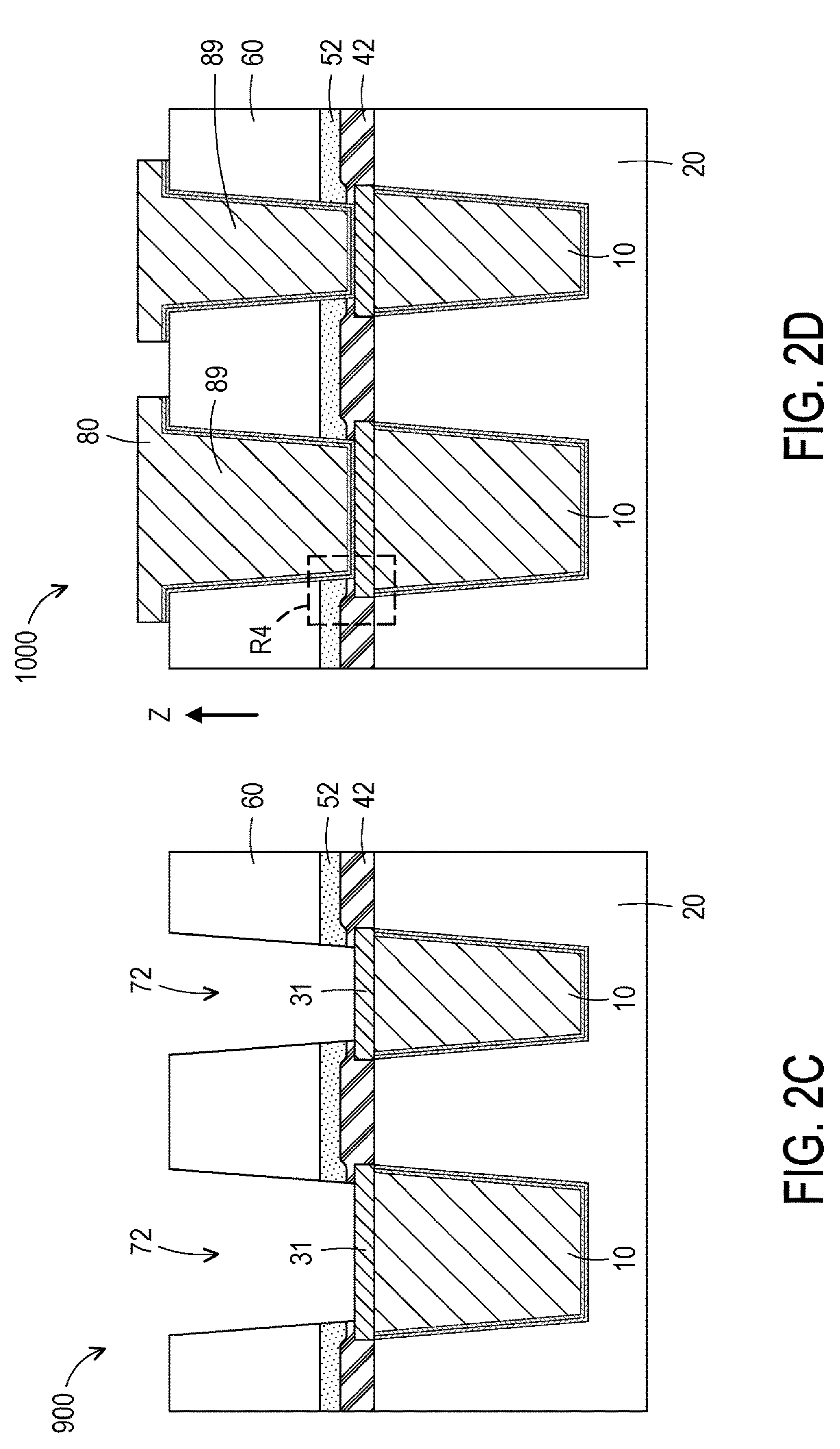
Figure 2F:
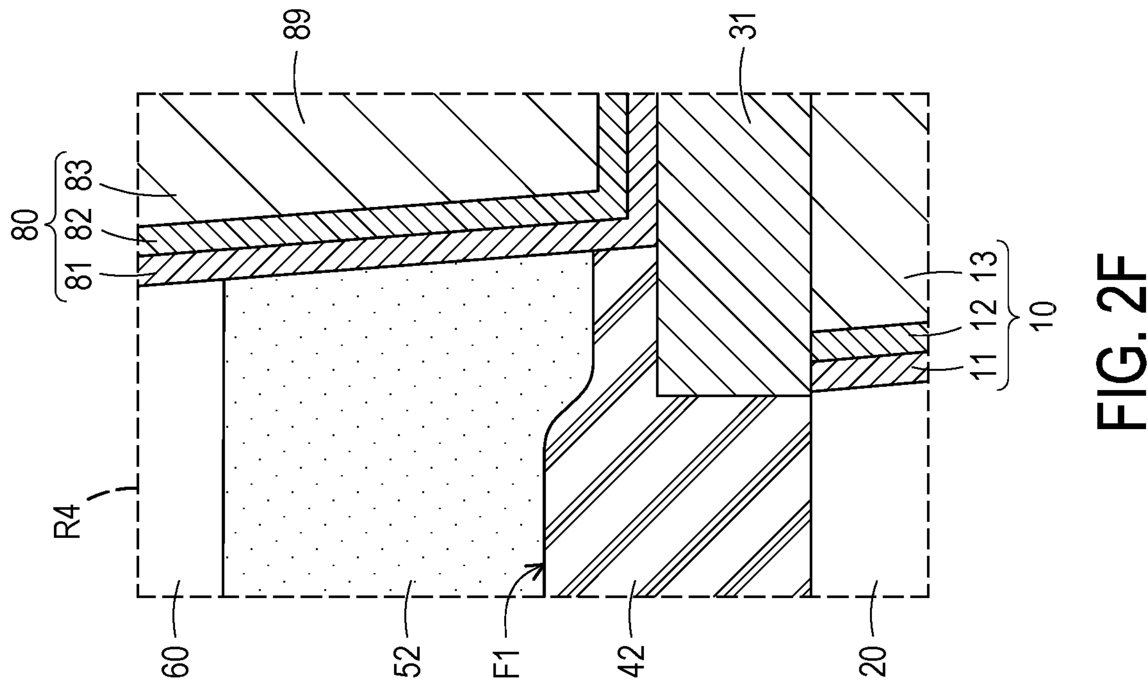
FIGS. 2E and 2F illustrate various cross-sectional views of a structure.
Figure 2E:
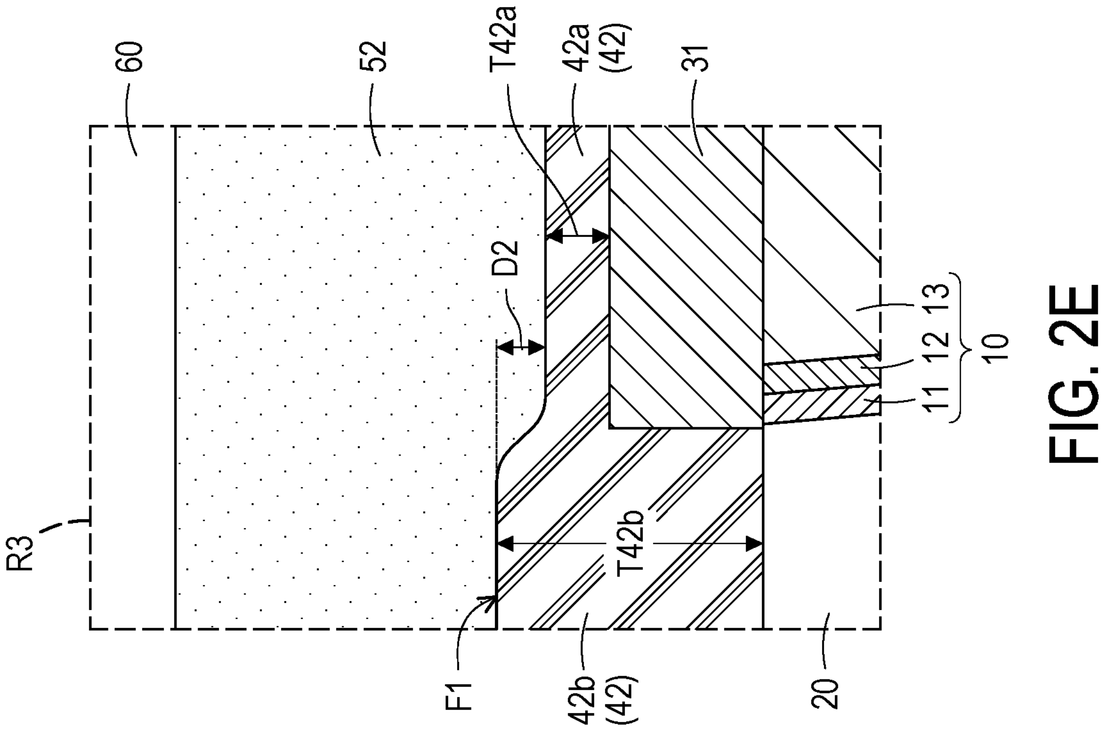

As shown in cross-sectional view of FIG. 2C, a structure 900 having at least one hole or trench 72 is provided. The hole or trench 72 may be formed by a suitable process (e.g., a lithography and etching process). A portion of the insulating layer(s) (e.g., the second insulating layer 52 and the third insulating layer 60) and a portion of the first insulating layer 42 disposed on the capping layer 31 may be removed, and further, a portion of the capping layer 31 may be exposed.

As shown in cross-sectional view of FIG. 2D, a structure 1000 including a conductor 80 is provided. A formation process and/or a material of the conductor 80 may be the same or similar to the formation process and/or the material of the aforementioned conductor 80 as shown in FIG. 1F.

FIGS. 3A-3E illustrate various cross-sectional views of some embodiments of a method of forming an electronic device. In some embodiments, FIGS. 3A-3E may illustrate an exemplary method of forming an electronic device after the structure as shown in FIG. 1A.

Figure 3B:
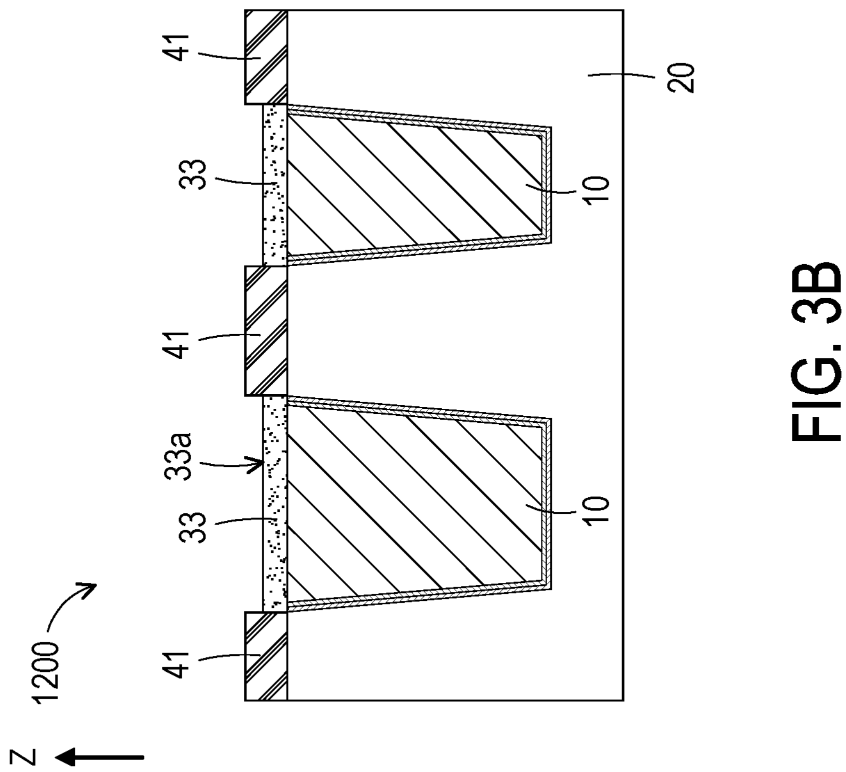
FIGS. 3A-3E illustrate various cross-sectional views of some embodiments of a method of forming an electronic device.
Figure 3A:
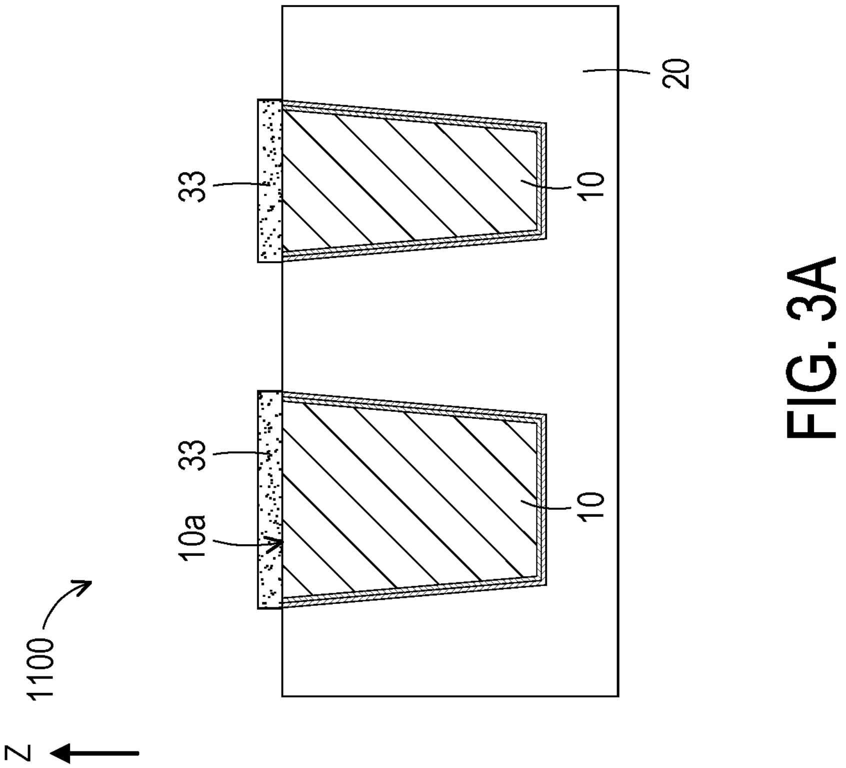

As shown in cross-sectional view of FIG. 3A, a structure 1000 including a capping layer 33 is provided. The capping layer 33 may be formed by a suitable process. For example, the capping layer 33 may be formed by a bottom-up deposition; or, a top-down removing process. A further process, such as a patterning process (e.g., a lithography and etching process, or the like) or a thermal process (e.g., heating, annealing, or the like), may be performed for forming the capping layer 33.

The capping layer 33 may be formed corresponding to the conductive region 10. For example, the capping layer 33 may be disposed on the top surface 10*a* of the conductive region 10, or further in direct contact therewith. In an embodiment, a thickness T33 of the capping layer 33 is about 3 angstroms (Å) to 300 angstroms.

A material of the capping layer 33 may include or be a 2D material. In an embodiment, in the thickness direction or the deposition direction (e.g., the z direction) of the capping layer 33, atoms forming the capping layer 33 substantially have no corresponding bonds or only weak bonds, and/or there may be substantially no dangling bond. That is, subsequent substances would be more difficult (but that doesn't mean they won't) to deposit or attach directly to the capping layer 33 in the thickness direction or the deposition direction (e.g., the z direction) thereof.

In an embodiment, the capping layer 33 may be a conductor and/or an insulator. A material of the capping layer 33 may include or be graphene, intercalated graphene, N-doped graphene, O-doped graphene, modified graphene, transition metal dichalcogenides (TMDs or TMDCs), hexagonal boron nitride (h-BN, graphitic BN), borocarbonitrides (BCN), germanane (GeH), $Ni_3(HITP)_2$ (HITP is 2,3,6,7,10,11-hexaiminotriphenylene).

As shown in cross-sectional view of FIG. 3B, a structure 1200 including a first insulating layer 41 is provided. A formation process and/or a material of the first insulating layer 41 may be the same or similar to the formation process and/or the material of the aforementioned first insulating layer 41.

In an embodiment, there may be substantially no first insulating layer 41 deposit or attach directly to the top surface 33*a* of the capping layer 33.

In an embodiment, a top surface of the first insulating layer 41 and the top surface 33*a* of the capping layer 33 are not coplanar. In an embodiment, in the thickness direction or the deposition direction (e.g., the z direction), the height difference D3 between the top surface of the first insulating layer 41 and the top surface 33*a* of the capping layer 33 is about 1 angstrom to 1000 angstroms.

Figures 3C, 3D:
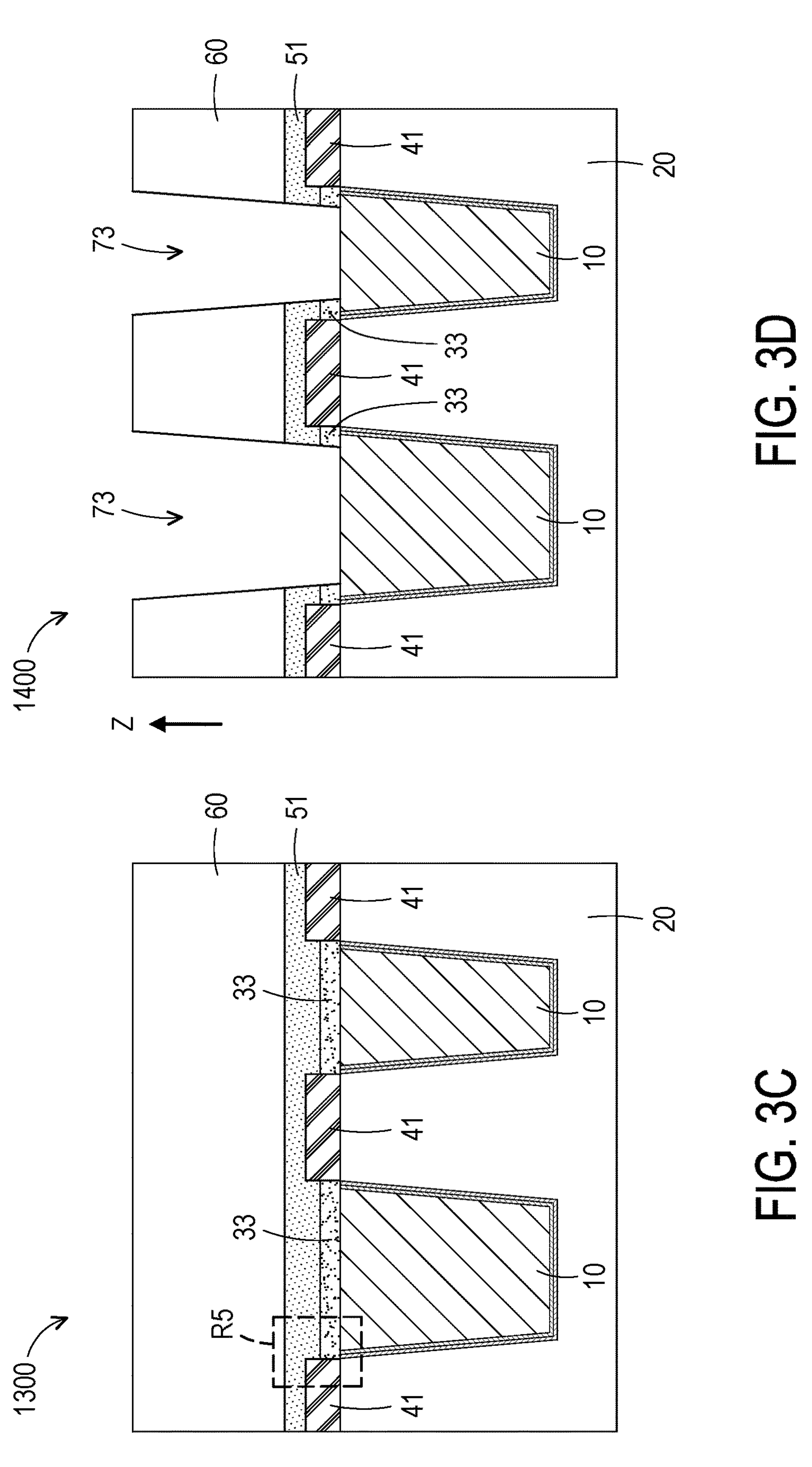

As shown in cross-sectional view of FIG. 3C, a structure 1300 including one or more insulating layers (e.g., the second insulating layer 51 and the third insulating layer 60) disposed on the first insulating layer 41 is provided. FIG. 3F may be an enlarged view of region R5 as shown in FIG. 3C.

A formation process and/or a material of the one or more insulating layers (e.g., the second insulating layer 51 and the third insulating layer 60 as shown in FIG. 3C and/or 3F) may be the same or similar to the formation process and/or the material of the aforementioned one or more insulating layers (e.g., the second insulating layer 51 and the third insulating layer 60 as shown in FIG. 1D and/or 1G).

As shown in cross-sectional view of FIG. 3D, a structure 1400 having at least one hole or trench is provided. The hole or trench 73 may be formed by a suitable process (e.g., a lithography and etching process). A portion of the insulating layer(s) (e.g., the second insulating layer 51 and the third insulating layer 60) and a portion of the capping layer 33 may be removed, and further, a portion of the conductive region 10 may be exposed.

Figure 3E:
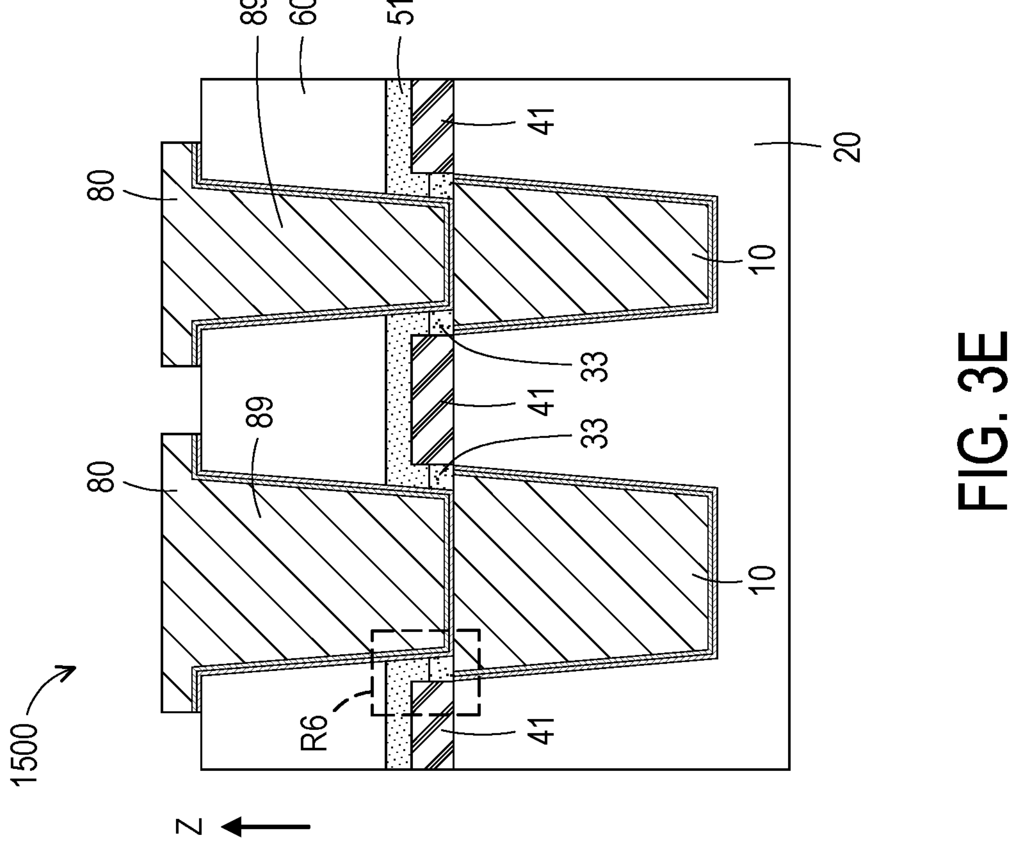
Figure 3G:
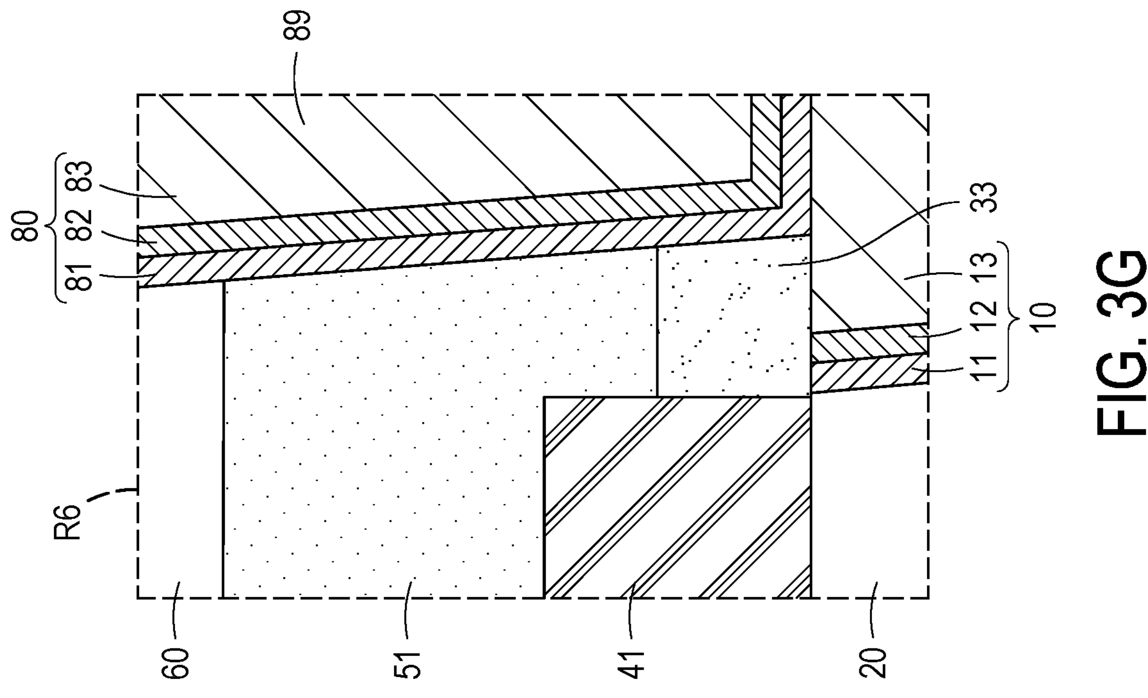
FIGS. 3F and 3G illustrate various cross-sectional views of a structure.
Figure 3F:
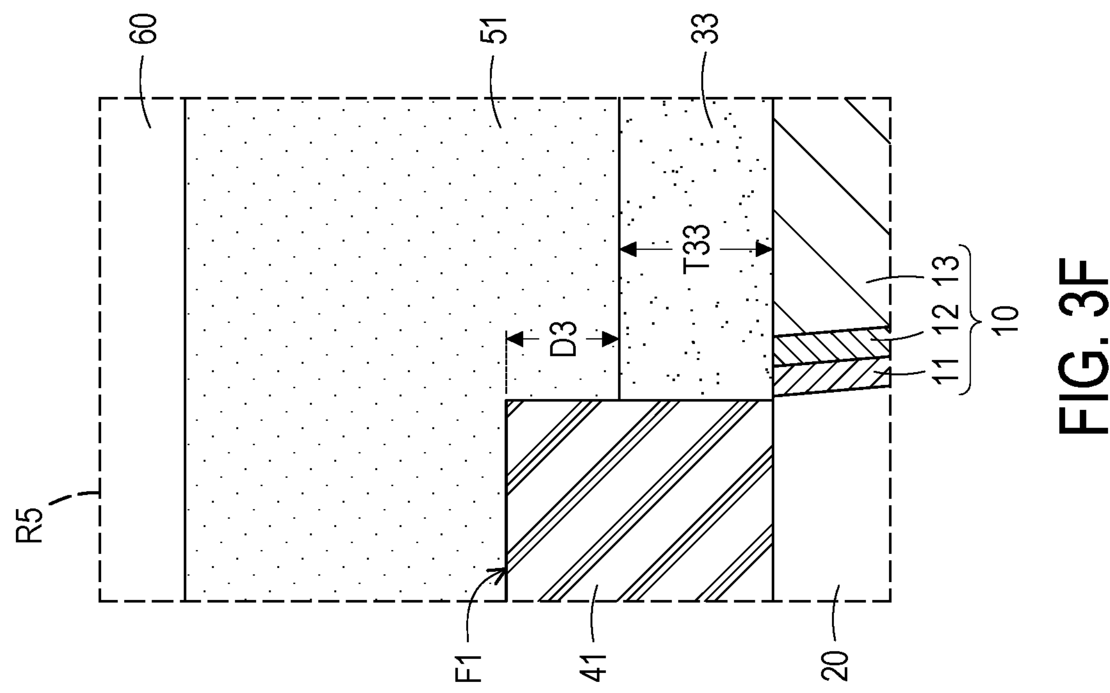

As shown in cross-sectional view of FIG. 3E, a structure 1500 including a conductor 80 is provided. FIG. 3G may be an enlarged view of region R6 as shown in FIG. 3E.

In an embodiment, a formation process and/or a material of the conductor 80 may be the same or similar to the formation process and/or the material of the aforementioned conductor 80 as shown in FIG. 1F.

In an embodiment, the conductor 80 may penetrate through the insulating layer(s) (e.g., the second insulating layer 51 and the third insulating layer 60) and the capping layer 33 to directly contact the corresponding conductive region 10.

FIGS. 4A-4D illustrate various cross-sectional views of some embodiments of a method of forming an electronic device.

In some embodiments, FIGS. 4A-4D may illustrate an exemplary method of forming an electronic device after the structure as shown in FIG. 3A.

Figure 4B:
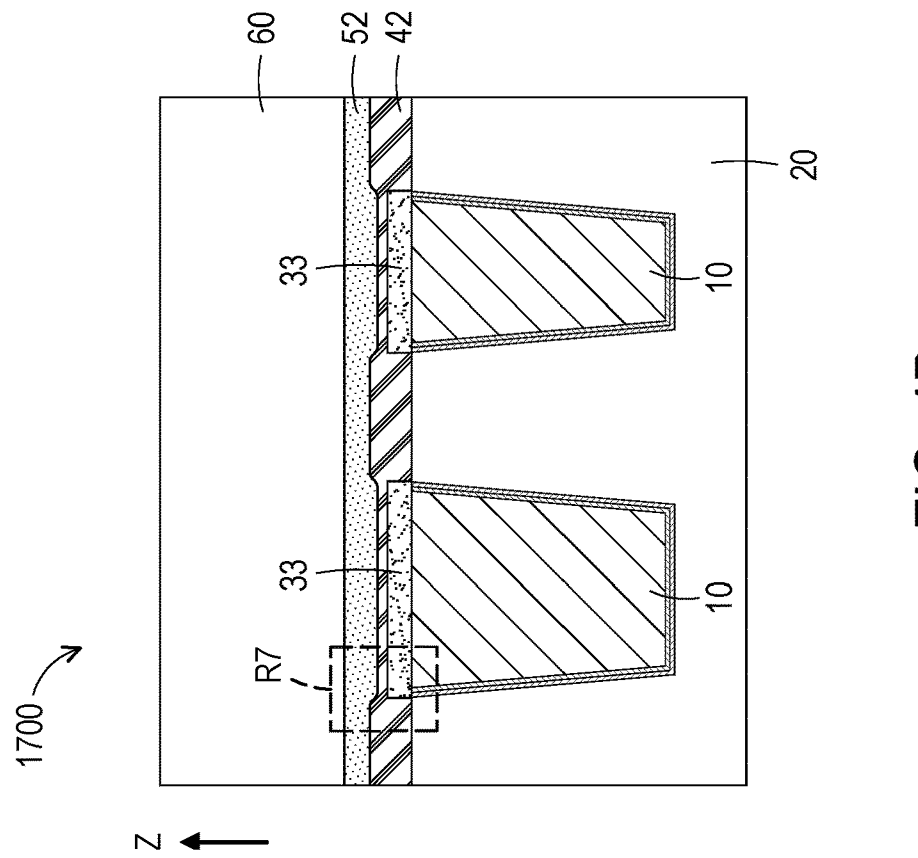
FIGS. 4A-4D illustrate various cross-sectional views of some embodiments of a method of forming an electronic device.
Figure 4A:
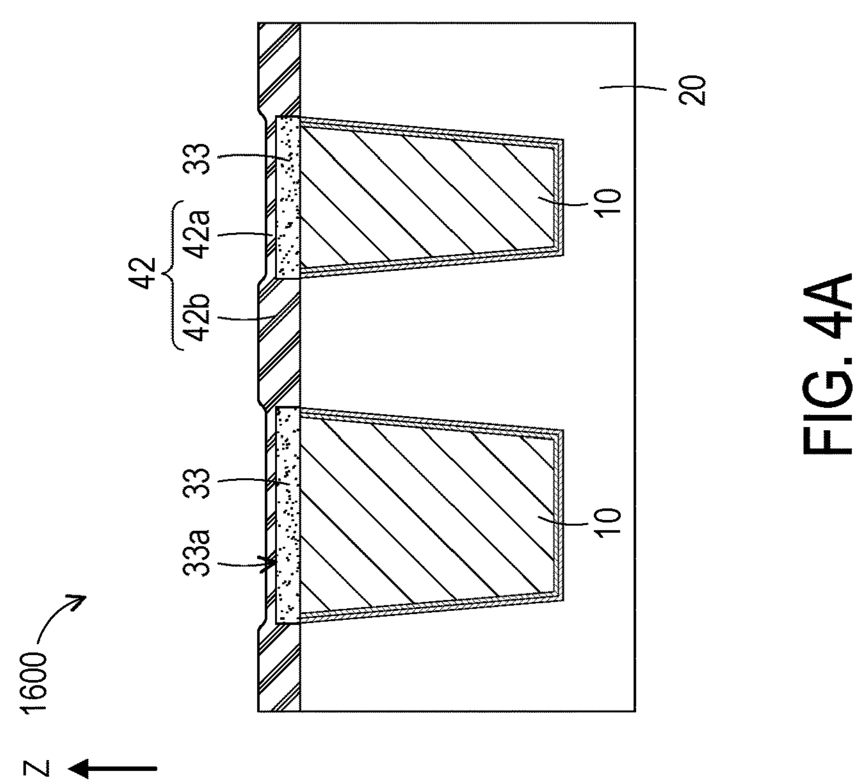

As shown in cross-sectional view of FIG. 4A, a structure 1600 including a first insulating layer 42 is provided. A formation process and/or a material of the first insulating layer 42 may be the same or similar to the formation process and/or the material of the aforementioned first insulating layer 42 as shown in FIG. 2A.

In an embodiment, a portion of the first insulating layer 42 may deposit or attach directly to the top surface 33*a* of the capping layer 33. The first insulating layer 42 may include a first portion 42*a* and a second portion 42*b*. In the thickness direction or the deposition direction (e.g., the z direction), the first portion 42*a* overlaps the capping layer 33, and the second portion 42*b* does not overlap the capping layer 33. A thickness T42*b* (as shown in FIG. 4E) of the second portion 42*b* may be thicker than a thickness T42*a* (as shown in FIG. 4E) of the first portion 42*a*.

In an embodiment, a top surface of the first portion 42*a* and a top surface of the second portion 42*b* are not coplanar. In an embodiment, in the thickness direction or the deposition direction (e.g., the z direction), the height difference D4 between the top surface of the first portion 42*a* and the top surface of the second portion 42*b* is about 1 angstrom to 1000 angstroms.

As shown in cross-sectional view of FIG. 4B, a structure 1700 including one or more insulating layers (e.g., the second insulating layer 52 and the third insulating layer 60) disposed on the first insulating layer 42 is provided. FIG. 4E may be an enlarged view of region R7 as shown in FIG. 4B.

In an embodiment, a formation process and/or a material of the one or more insulating layers (e.g., the second insulating layer 52 and the third insulating layer 60 as shown in FIG. 4B and/or 4E) may be the same or similar to the formation process and/or the material of the aforementioned one or more insulating layers (e.g., the second insulating layer 52 and the third insulating layer 60 as shown in FIG. 2B and/or 2E).

The first portion 42*a* of the first insulating layer 42 may be disposed between the one or more insulating layers (e.g., the second insulating layer 52 and the third insulating layer 60 as shown in FIG. 4B and/or 4E) and the capping layer 33.

Figures 4C, 4D:
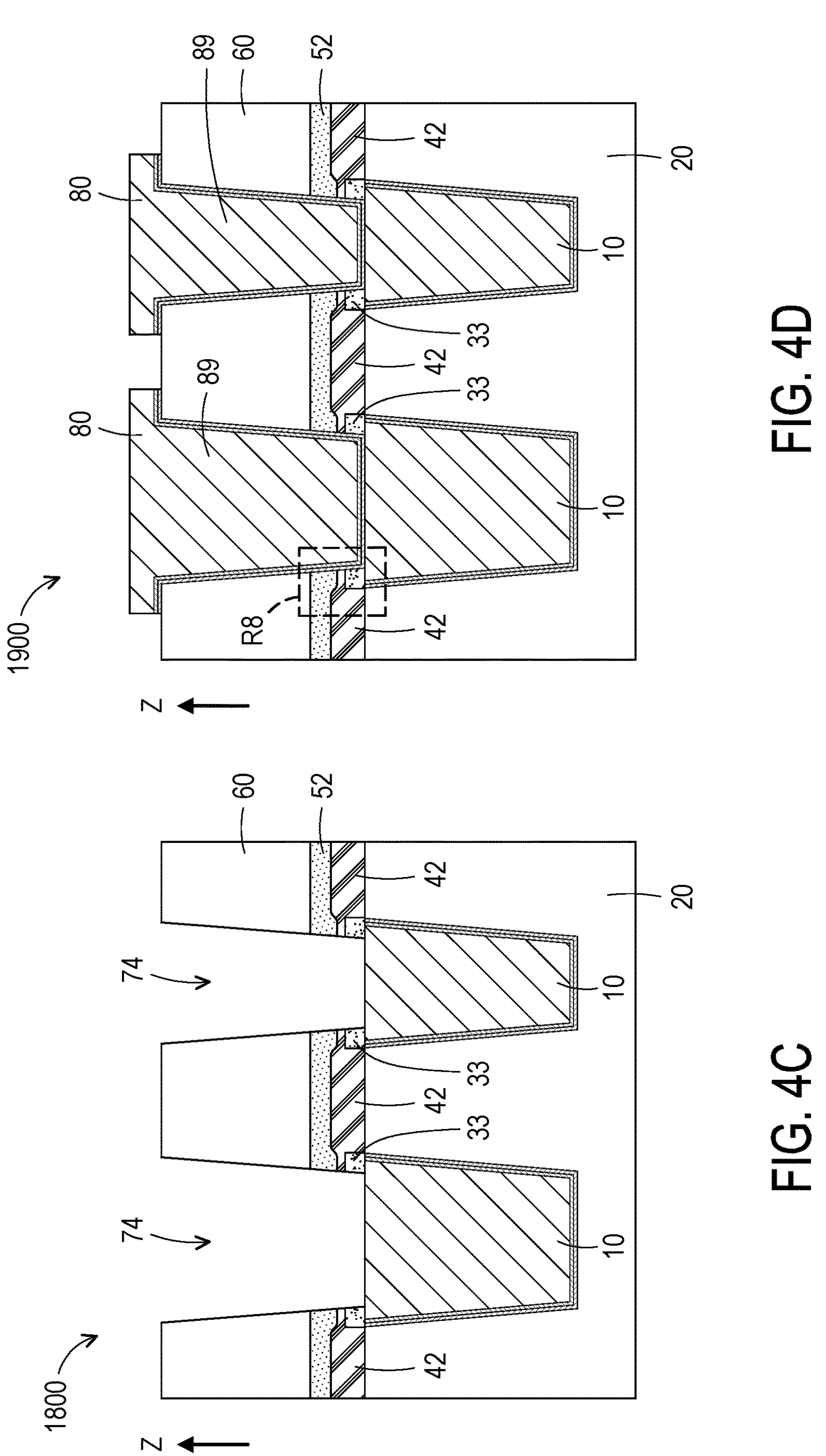

As shown in cross-sectional view of FIG. 4C, a structure 1800 having at least one hole or trench 74 is provided. The hole or trench 74 may be formed by a suitable process (e.g., a lithography and etching process). A portion of the insulating layer(s) (e.g., the second insulating layer 52 and the third insulating layer 60), a portion of the first insulating layer 42 disposed on the capping layer 33, and a portion of the capping layer 33 may be removed, and further, a portion of the conductive region 10 may be exposed.

Figure 4F:
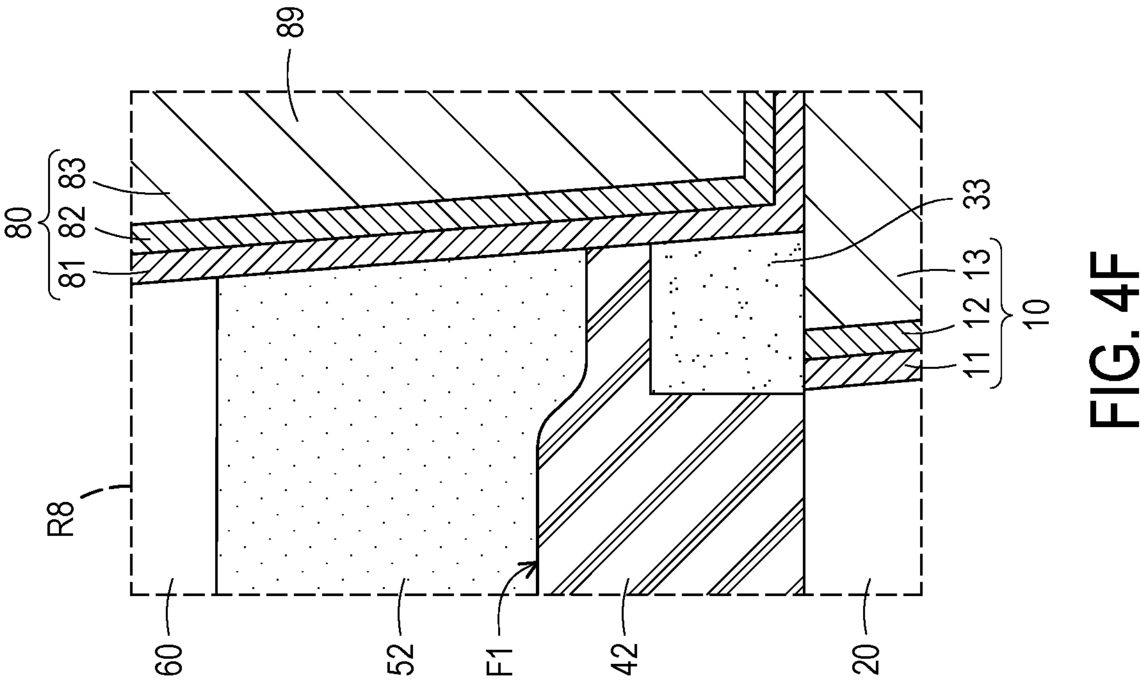
FIGS. 4E and 4F illustrate various cross-sectional views of a structure.
Figure 4E:
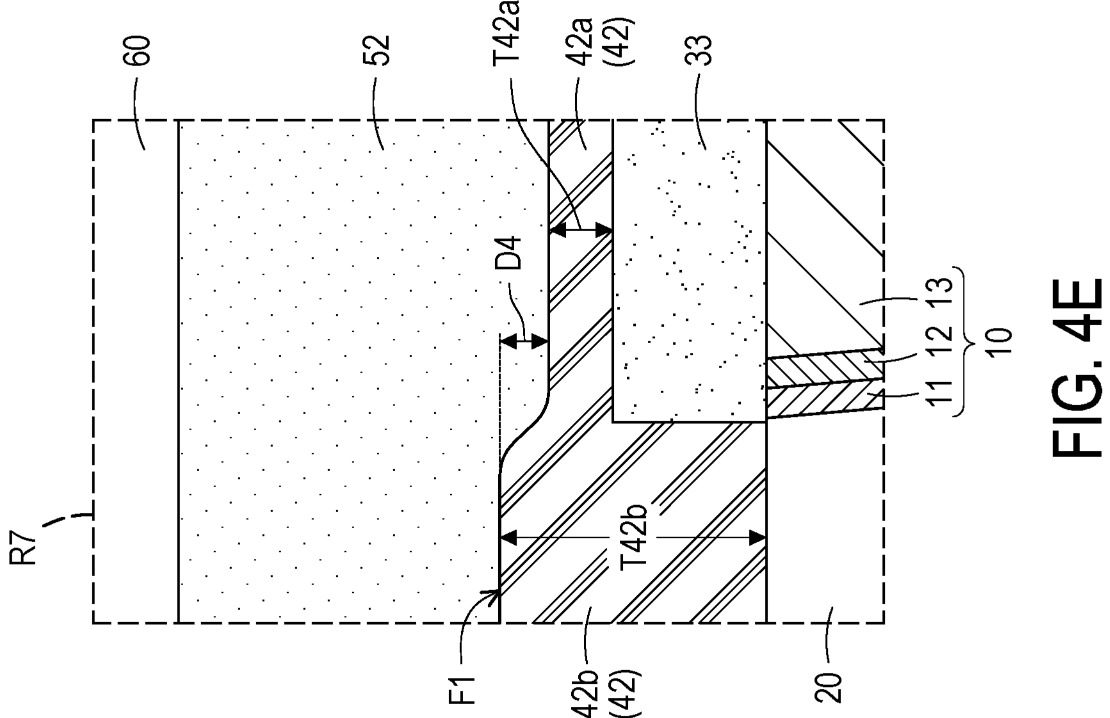

As shown in cross-sectional view of FIG. 4D, a structure 1900 including a conductor 80 is provided. FIG. 4F may be an enlarged view of region R8 as shown in FIG. 4D.

In an embodiment, a formation process and/or a material of the conductor 80 may be the same or similar to the formation process and/or the material of the aforementioned conductor 80 as shown in FIG. 1F.

In an embodiment, the conductor 80 may penetrate through the insulating layer(s) (e.g., the second insulating layer 52 and the third insulating layer 60), the first insulating layer 42, and the capping layer 33 to directly contact the corresponding conductive region 10.

One or more of the structures, processes, features, and/or functions illustrated in the figure(s) may be rearranged and/or combined into a single structure, process, feature or function or embodied in several structures, processes, or functions. One or more additional structures, processes, features, and/or functions may also be added without departing from the disclosure. The structure 100-1900 of the aforementioned embodiments may be a portion of an electronic device. For example, in an exemplary embodiment not shown, a single device may include one or more structures of the structure 400 as shown in FIG. 1D, the structure 600 as shown in FIG. 1F, the structure 800 as shown in FIG.

2B, the structure 1000 as shown in FIG. 2D, the structure 1300 as shown in FIG. 3C, the structure 1500 as shown in FIG. 3E, the structure 1700 as shown in FIG. 4B, and/or the structure 1900 as shown in FIG. 4D. An electronic device may be, for example, a die, a chip, a panel (e.g., a display panel or a touch panel), a circuit board, or an interposer, but the disclosure is not limited thereto.

Figure 5:
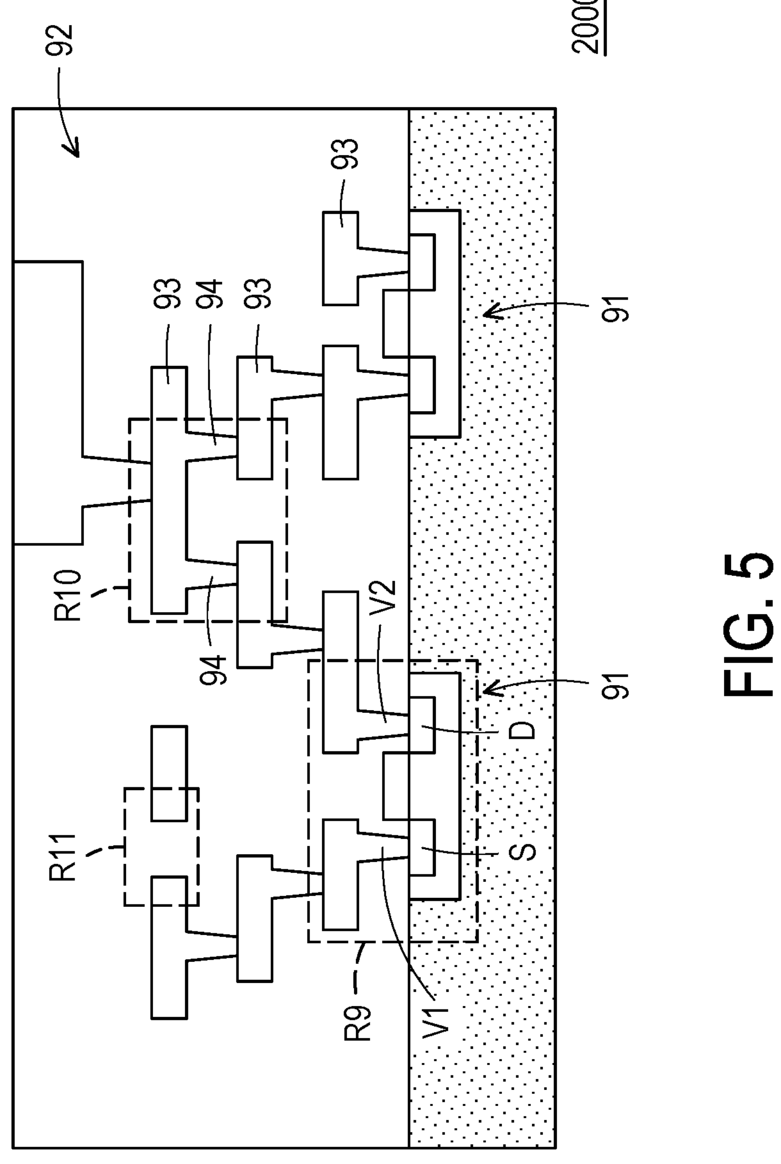
FIG. 5 illustrate an exemplary cross-sectional view of an electronic device.

FIG. 5 illustrate an exemplary cross-sectional view of a die. The die may include an active device (e.g., a transistor), a passive device (e.g., a resistor, a capacitor, or an inductance), and/or an interconnect structure. The device may be formed using front-end of line (FEOL) fabrication techniques. The interconnect structure may be formed using back-end of line (BEOL) fabrication techniques and may be electrically coupled to a corresponding device. The die 2000 as shown in FIG. 5 exemplarily illustrate a corresponding active device 91 and a corresponding interconnect structure 92.

Referring to FIG. 5 and the aforementioned figures, the structure of the aforementioned embodiments may be a portion of the die 2000. For simplicity of illustration, a corresponding capping layer is omitted in the FIG. 5.

For example, the aforementioned conductive region 10 may correspond to a source region S and/or a drain region D, and the conductor 90 electrically coupled to the corresponding conductive region may correspond to a source via V1 and/or a drain via V2. For example, the structure 600 as shown in FIG. 1F, the structure 1000 as shown in FIG. 2D, the structure 1500 as shown in FIG. 3E, or the structure 1900 as shown in FIG. 4D may correspond to the region R9 as shown in FIG. 5.

For example, the aforementioned conductive region 10 may correspond to a conductive layer (e.g., an M0 layer, an M1 layer, . . . or an Mn layer) 93 of the interconnect structure 92, and the conductor 80 or conductive via 89 electrically coupled to the corresponding conductive region 10 may correspond to a via 94 electrically connected to two adjacent conductive layers 93. For example, the structure 600 as shown in FIG. 1F, the structure 1000 as shown in FIG. 2D, the structure 1500 as shown in FIG. 3E, or the structure 1900 as shown in FIG. 4D may correspond to the region R10 as shown in FIG. 5.

For example, the aforementioned conductive region 10 may correspond to a conductive layer (e.g., an M0 layer, an M1 layer, . . . or an Mn layer) 93 of the interconnect structure 92. For example, the structure 400 as shown in FIG. 1D, the structure 800 as shown in FIG. 2B, the structure 1300 as shown in FIG. 3C, or the structure 1700 as shown in FIG. 4B may correspond to the region R11 as shown in FIG. 5.

As above, a structure with a capping layer including 2D materials may have low-resistance and/or low-capacitance. As such, in the application of the structure, an electronic device including the aforementioned structure may have better signal quality.

In accordance with some embodiments of the present disclosure, a structure includes a conductive region, a dielectric region, and a capping layer. The conductive region is disposed on or embedded in the dielectric region. The capping layer is disposed on the conductive region. A material of the capping layer includes a 2D material.

In accordance with an embodiment of the disclosure, the capping layer is in direct contact with the conductive region, and a material of the capping layer includes copper.

In accordance with an embodiment of the disclosure, the 2D material includes graphene, intercalated graphene, N-doped graphene, O-doped graphene, modified graphene, a transition metal dichalcogenide, hexagonal boron nitride (h-BN, graphitic BN), borocarbonitrides (BCN), germanane (GeH), or $Ni_3(HITP)_2$.

In accordance with an embodiment of the disclosure, the structure further includes a first insulating layer disposed on the dielectric region. A top surface of the first insulating layer and a top surface of the capping layer are not coplanar.

In accordance with an embodiment of the disclosure, the first insulating layer is further disposed on the capping layer.

In accordance with an embodiment of the disclosure, the first insulating layer includes a first portion overlapping the capping layer and a second portion not overlapping the capping layer, and a top surface of the first portion and a top surface of the second portion are not coplanar.

In accordance with an embodiment of the disclosure, the structure further includes a second insulating layer and a conductor. The second insulating layer is disposed on the first insulating layer and the capping layer. The conductor penetrates through the second insulating layer to be electrically connected to the conductive region.

In accordance with an embodiment of the disclosure, there is a contact interface between the first insulating layer and the second insulating layer.

In accordance with an embodiment of the disclosure, the capping layer is disposed and electrically connected between the conductive region and conductor.

In accordance with an embodiment of the disclosure, the conductor further penetrates through the capping layer.

In accordance with some embodiments of the present disclosure, a structure includes a conductive region, a dielectric region, a capping layer, and a first insulating layer. The conductive region is disposed on or embedded in the dielectric region. The capping layer is disposed on the conductive region. The first insulating layer is disposed on the dielectric region. A top surface of the first insulating layer and a top surface of the capping layer are not coplanar.

In accordance with an embodiment of the disclosure, the first insulating layer does not directly contact a copper material of the conductive region substantially.

In accordance with some embodiments of the present disclosure, a method including the following step is provided: providing a structure including a conductive region and a dielectric region, wherein the conductive region is disposed on or embedded in the dielectric region; forming a capping layer disposed on the conductive region; and forming a first insulating layer disposed on the dielectric region, wherein a top surface of the first insulating layer and a top surface of the capping layer are not coplanar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a conductive region and a dielectric region, wherein the conductive region is disposed on or embedded in the dielectric region;

a capping layer, disposed on the conductive region, wherein a material of the capping layer comprises a 2D material; and a first insulating layer, comprising a first portion in contact with the capping layer and a second portion in contact with the dielectric region, wherein a maximum thickness of the second portion is thicker than a maximum thickness of the first portion, a topmost surface of the first portion is lower than a topmost surface of the second portion, and the capping layer is disposed between the conductive region and the first insulating layer, and the conductive region and the first insulating layer are spaced apart from each other by the capping layer.

2. The structure of claim 1, wherein the capping layer is in contact with the conductive region, and a material of the capping layer comprises copper.

3. The structure of claim 1, wherein the 2D material comprises graphene, intercalated graphene, N-doped graphene, O-doped graphene, modified graphene, a transition metal dichalcogenide, hexagonal boron nitride, borocarbonitrides (BCN), germanane (GeH), or $Ni_3(HITP)_2$.

4. The structure of claim 1, wherein a top surface of the first insulating layer and a top surface of the capping layer are not coplanar.

5. The structure of claim 1, wherein the conductive region comprises:

a first conductive layer, comprising a conductive barrier layer;

a second conductive layer, comprising a liner layer or a conductive glue layer; and a third conductive layer, comprising a conductive damascene layer, wherein a thickness and a cross-sectional area of the third conductive layer are greater than a thickness and a cross-sectional area of the first conductive layer, the thickness and the cross-sectional area of the third conductive layer are greater than a thickness and a cross-sectional area of the second conductive layer, and the capping layer is in contact with the first conductive layer, the second conductive layer, and the third conductive layer.

6. The structure of claim 1, wherein the second portion does not overlap the capping layer.

7. The structure of claim 1, further comprising:

a second insulating layer, disposed on the first insulating layer and the capping layer; and a conductor, penetrating through the second insulating layer to being electrically connected to the conductive region.

8. The structure of claim 7, wherein there is a contact interface between the first insulating layer and the second insulating layer.

9. The structure of claim 7, wherein the capping layer is disposed and electrically connected between the conductive region and conductor.

10. The structure of claim 7, wherein the conductor further penetrates through the capping layer.

11. A structure comprising:

a conductive region and a dielectric region, wherein the conductive region is disposed on or embedded in the dielectric region;

a capping layer, disposed on the conductive region, wherein a material of the capping layer comprises a 2D material; and a first insulating layer, disposed on the dielectric region and the capping layer, wherein a top surface of the first insulating layer and a top surface of the capping layer are not coplanar, a top surface of the conductive region, a top surface of the dielectric region, a bottom surface of the capping layer, and a bottom surface of the first insulating layer are coplanar, the first insulating layer comprises a first portion vertically overlapping the capping layer and a second portion vertically overlapping the dielectric region, a top surface of the second portion comprises a downward slope adjacent to an interface between the first portion and the second portion such that a topmost surface of the first portion is lower than a topmost surface of the second portion, and the capping layer is disposed between the conductive region and the first insulating layer, and the conductive region and the first insulating layer are spaced apart from each other by the capping layer.

12. The structure of claim 11, wherein the first insulating layer does not directly contact a copper material of the conductive region.

13. The structure of claim 11, wherein the conductive region comprises:

a first conductive layer, comprising a conductive barrier layer;

a second conductive layer, comprising a liner layer or a conductive glue layer; and a third conductive layer, comprising a conductive damascene layer, wherein a thickness and a cross-sectional area of the third conductive layer are greater than a thickness and a cross-sectional area of the first conductive layer, the thickness and the cross-sectional area of the third conductive layer are greater than a thickness and a cross-sectional area of the second conductive layer, and the capping layer is in contact with the first conductive layer, the second conductive layer, and the third conductive layer.

14. The structure of claim 11, wherein the first portion overlaps the capping layer, and the second portion does not overlap the capping layer.

15. The structure of claim 11, further comprising:

a second insulating layer, disposed on the first insulating layer and the capping layer; and a conductor, penetrating through the second insulating layer to being electrically connected to the conductive region.

16. The structure of claim 15, wherein there is a contact interface between the first insulating layer and the second insulating layer.

17. The structure of claim 15, wherein the capping layer is disposed and electrically connected between the conductive region and conductor.

18. The structure of claim 15, wherein the conductor further penetrates through the capping layer.

19. A method comprising:

providing a structure comprising a conductive region and a dielectric region, wherein the conductive region is disposed on or embedded in the dielectric region;

forming a capping layer disposed on the conductive region, wherein a material of the capping layer comprises a 2D material; and forming a first insulating layer comprising a first portion in contact with the capping layer and a second portion in contact with the dielectric region, wherein a maximum thickness of the second portion is thicker than a maximum thickness of the first portion, a topmost surface of the first portion is lower than a topmost surface of the second portion, the capping layer is disposed between the conductive region and the first insulating layer, and the conductive region and the first insulating layer are spaced apart from each other by the capping layer, and a top surface of the first insulating layer and a top surface of the capping layer are not coplanar.

20. The method of claim 19, further comprising:

forming a second insulating layer disposed on the first insulating layer and the capping layer; and forming a conductor penetrating through the second insulating layer to be electrically connected to the conductive region.

* * * * *